United States Patent
Mayer et al.

(10) Patent No.: US 11,177,644 B2
(45) Date of Patent: Nov. 16, 2021

(54) SMART ELECTRONIC SWITCH

(71) Applicant: Infineon Technologies AG, Neubiberg (DE)

(72) Inventors: Alexander Mayer, Treffen (AT); Robert Illing, Finkenstein (AT); Marco Faricelli, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/923,030

(22) Filed: Jul. 7, 2020

(65) Prior Publication Data

US 2021/0028615 A1 Jan. 28, 2021

(30) Foreign Application Priority Data

Jul. 24, 2019 (DE) .......................... 102019119972.7

(51) Int. Cl.
*H02H 3/00* (2006.01)
*H02H 3/087* (2006.01)
(Continued)

(52) U.S. Cl.
CPC ............. *H02H 3/087* (2013.01); *G01R 19/15* (2013.01); *G01R 19/16538* (2013.01);
(Continued)

(58) Field of Classification Search
None
See application file for complete search history.

(56) References Cited

U.S. PATENT DOCUMENTS 6,144,085 A 11/2000 Barker
7,279,765 B2 10/2007 Ahn et al.
(Continued)

FOREIGN PATENT DOCUMENTS

DE 102004063946 A1 3/2006
DE 102016100498 A1 7/2016
(Continued)

OTHER PUBLICATIONS

Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).

(Continued)

*Primary Examiner* — Stephen W Jackson
(74) *Attorney, Agent, or Firm* — Shumaker & Sieffert, P.A.

(57) ABSTRACT

A circuit may include an electronic switch that has a load current path coupled between an output node and a supply node and that is configured to connect or disconnect the output node and the supply node in accordance with a drive signal. Further, the circuit includes a monitoring circuit that is configured to receive a current sense signal, which represents the load current passing through the load current path, and that is further configured to determine a protection signal based on the current sense signal, a state of the monitoring circuit, and at least one wire parameter. The wire parameter characterizes a wire that is—during operation—connected to the output node, and the protection signal is indicative of whether to disconnect the output node from supply node. Further, the circuit includes a protection circuit connected to the monitoring circuit.

11 Claims, 6 Drawing Sheets

(51) Int. Cl.
| | |
|---|---|
| *H02H 3/04* | (2006.01) |
| *H02H 3/06* | (2006.01) |
| *H02H 5/04* | (2006.01) |
| *H03M 1/34* | (2006.01) |
| *H02H 1/00* | (2006.01) |
| *G01R 19/165* | (2006.01) |
| *G01R 19/15* | (2006.01) |
| *H03K 5/24* | (2006.01) |

(52) U.S. Cl.
CPC .......... *H02H 1/0092* (2013.01); *H02H 3/006* (2013.01); *H02H 3/04* (2013.01); *H02H 3/06* (2013.01); *H02H 5/04* (2013.01); *H03K 5/24* (2013.01); *H03M 1/34* (2013.01)

(56) References Cited

U.S. PATENT DOCUMENTS

| | | | |
|---|---|---|---|
| 7,489,855 | B2 | 2/2009 | Kraus |
| 9,293,907 | B2 * | 3/2016 | Ueta ................ H02H 7/18 |
| 9,413,352 | B2 | 8/2016 | Lim |
| 9,672,201 | B1 | 6/2017 | Uszkoreit et al. |
| 9,705,394 | B2 * | 7/2017 | Ohshima ............ H02M 1/32 |
| 9,887,532 | B2 | 2/2018 | Djelassi et al. |
| 10,170,905 | B2 * | 1/2019 | Illing ................ H02H 3/087 |
| 10,305,363 | B1 | 5/2019 | Chen et al. |
| 2002/0024376 | A1 | 2/2002 | Sander |
| 2005/0184715 | A1 | 8/2005 | Kidokoro et al. |
| 2005/0270869 | A1 | 12/2005 | Krischke et al. |
| 2007/0008744 | A1 | 1/2007 | Heo et al. |
| 2012/0194119 | A1 | 8/2012 | Kroeze et al. |
| 2013/0301175 | A1 | 11/2013 | Posat |
| 2014/0078629 | A1 | 3/2014 | Cortigiani et al. |
| 2014/0091384 | A1 | 4/2014 | Petruzzi et al. |
| 2017/0063077 | A1 | 3/2017 | Donath et al. |
| 2017/0294772 | A1 | 10/2017 | Illing et al. |
| 2017/0294918 | A1 | 10/2017 | Illing et al. |
| 2017/0294922 | A1 | 10/2017 | Illing et al. |
| 2017/0366116 | A1 | 12/2017 | Ogawa et al. |
| 2018/0287365 | A1 | 10/2018 | Djelassi-Tscheck et al. |
| 2020/0021207 | A1 | 1/2020 | Donat et al. |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| WO | 01/69784 A1 | 9/2001 |

OTHER PUBLICATIONS

Infineon Technologies AG, "BTN8962TA High Current PN Half Bridge NovalithIC™," Data Sheet, Rev. 1.0, May 17, 2013, 26 pp.
International Standard ISO 7637-2, Third Edition, Mar. 1, 2011, entitled "Road vehicles-Electrical disturbances from conduction and coupling-Part 2: Electrical transient conduction along supply lines only," 48 pp.
International Standard ISO 26262-1, Second Edition, Dec. 2018, entitled "Road vehicles-Functional safety-Part 1: Vocabulary," 42 pp.
Office Action, in the German language, from counterpart German Application No. DE 10 2019 119 972.7, dated Apr. 1, 2020, 4 pp.

* cited by examiner

SMART ELECTRONIC SWITCH

This application claims priority to German Patent Application Number 102019119972.7, filed Jul. 24, 2019, the entire content of which is incorporated herein by reference.

TECHNICAL FIELD

The present disclosure relates to the field of smart semiconductor switches.

BACKGROUND

Almost every electric installation (e.g. in an automobile, in a house, electric subsystems of larger installations) includes one of more fuses to provide over-current protection. Standard fuses include a piece of wire which provides a low-ohmic current path when the current passing through the fuse is below a nominal current. However, the piece of wire is designed to heat up and melt or vaporize when the current passing through the fuse exceeds the nominal current for a specific time. Once triggered a fuse has to be replaced by a new one.

Fuses are being increasingly replaced by circuit breakers. A circuit breaker is an automatically operated electrical switch designed to protect an electrical circuit from damage caused by overcurrent or overload or short-circuit. Circuit breakers may include electro-mechanical relays, which are triggered to disconnect the protected circuit from the supply when an over-current (i.e. a current exceeding the nominal current) is detected. In many applications (e.g. in the on-board power supply of an automobile), circuit breakers may be implemented using an electronic switch (e.g. a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually, the switching state (on/off) of electronic switches such as MOS transistors is controlled using so-called driver circuits or simply drivers (gate drivers in case of MOS transistors).

However, at least in some electronic circuit breakers (electronic fuses or e-fuses) common driver circuits may be inadequate with regard to fault tolerance and functional safety, which may be an issue particularly in automotive applications, in which standards concerning functional safety must be complied with (e.g. ISO 26262). In fact, an electronic fuse is more than just a classical fuse replaced by an electronic switch. A robust implementation of an electronic fuse entails various challenges.

SUMMARY

A circuit that may be used as an electronic fuse is described herein. In accordance with one embodiment, the circuit includes an electronic switch that has a load current path coupled between an output node and a supply node and that is configured to connect or disconnect the output node and the supply node in accordance with a drive signal. Further, the circuit includes a monitoring circuit that is configured to receive a current sense signal, which represents the load current passing through the load current path, and that is further configured to determine a protection signal based on the current sense signal, a state of the monitoring circuit, and at least one wire parameter. The wire parameter characterizes a wire that is—during operation— connected to the output node, and the protection signal is indicative of whether to disconnect the output node from supply node. Further, the circuit includes a protection circuit connected to the monitoring circuit and configured to store the state of the monitoring circuit in one or more registers that are included in the protection circuit. The protection circuit is configured to receive a logic supply voltage at an input node, and it includes a supply circuit configured to provide a temporary supply for the protection circuit when the supply voltage received at an input node drops below a given threshold value.

Furthermore, a method is described herein that, in accordance with one embodiment includes establishing and disconnecting a load current path between a supply pin and an output pin by switching a transistor on and off, generating a current sense signal indicative of a load current passing through the transistor, and determining, using a monitoring circuit, a protection signal based on the current sense signal, a state of the monitoring circuit, and at least one wire parameter that characterizes a wire connected to the output node. The protection signal is indicative of whether to disconnect the output node from supply node. The method further includes storing the state of the monitoring circuit in one or more registers included in a protection circuit, and providing, by a supply circuit included in the protection circuit a temporary supply for the one or more registers, when a logic supply potential received at an input node of the protection circuit deviates from an internal supply potential buffered by the supply circuit by more than a given threshold value.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

Figure 1:
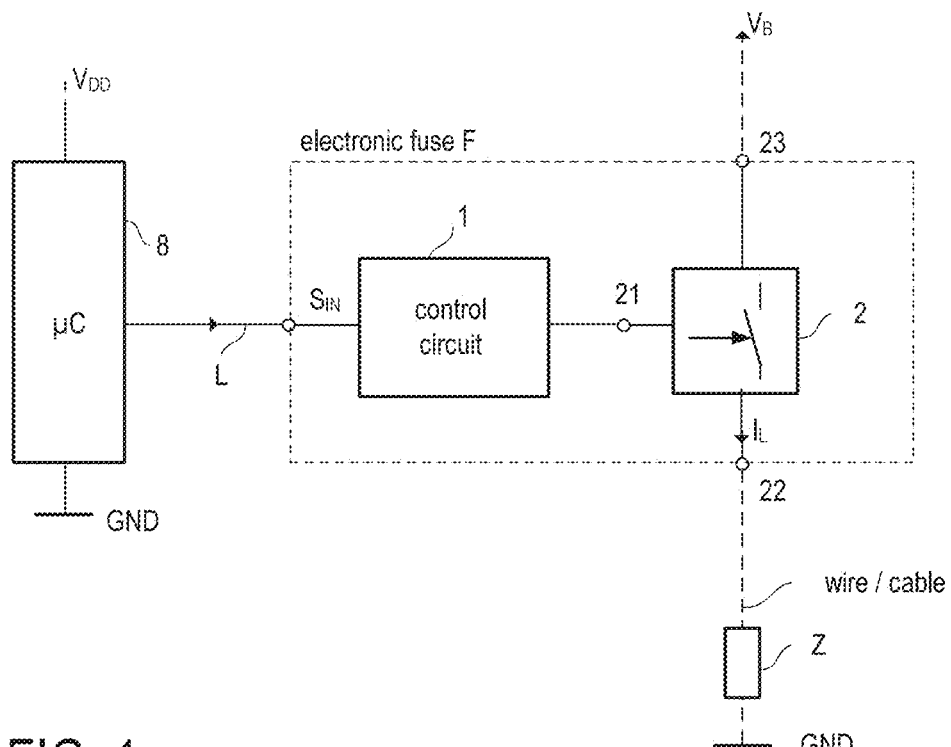
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit, which may be operated as an electronic fuse. Therefore, the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated in one semiconductor die (chip) or may be integrated in two semiconductor dies that are arranged in one integrated circuit package. The electronic fuse circuit F is configured to drive a load Z (the wires connecting the load are illustrated in dashed lines in FIG. 1) that can be connected in series with the load current path of the electronic switch 2. Thus, the series circuit of the load current path of the electronic switch 2 and load Z may be connected between supply nodes, at which a positive supply potential and a negative supply potential or ground potential GND (zero volts) may be provided. In the following, a voltage between the two supply nodes is referred to as supply voltage $V_B$. The load current $i_L$ passing through the load Z may be switched on and off in accordance with an input signal $S_{IN}$ supplied to the control circuit 1, for example, by a micro controller 8. However, dependent on the application, the input signal $S_{IN}$ may be generated by any other circuitry instead of a micro controller.

In an exemplary application, the electronic fuse circuit F may be used to drive a load Z in an automobile. In this case, a power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. In the example illustrated in FIG. 1, the electronic switch 2 and the load Z are connected in a high-side configuration. That is, the load Z is connected between the electronic switch 2 and the ground node GND. This, however, is only an example. The electronic switch 2 and the load Z may also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g. included in a cable). Dependent on where the electronic circuit and the respective load Z are located within the electric installation of an automobile, the wire may have a considerable length of several 10 cm or even more (e.g. up to 10 m). A modern automobile includes a plurality of electric loads, so that a plurality of wires are required to connect the individual loads to their respective electronic switches. In order to save costs and resources, it may be desirable to dimension the individual wires such that they withstand, over a long term, a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z). The current monitoring allows to switch off the electronic switch 2 in order to protect the wire (and the load Z) when an overload scenario is detected. An "overload scenario" is a scenario that may result in the wire or the load being damaged or destroyed if the electronic switch 2 is not switched off (within a specific time) to disconnect the wire (and the load Z) from the power source that provides the supply voltage $V_B$ (e.g. the automobile battery). This mechanism is explained in further detail herein below. As the electronic fuse circuit F is configured to switch on and off the load Z and to protect the wire, it is also referred to as switching and protection circuit in the following.

In the example of FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state, in which the electronic switch 2 is capable of conducting a current between the first load node 22 and the second load node 23. "Switched off" means that the electronic switch 2 is operated in an off-state, in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, it may also be possible that the functions of the individual functional blocks are performed by a programmable circuit (processor) that is configured to execute software/firmware stored in a memory.

Figure 2:
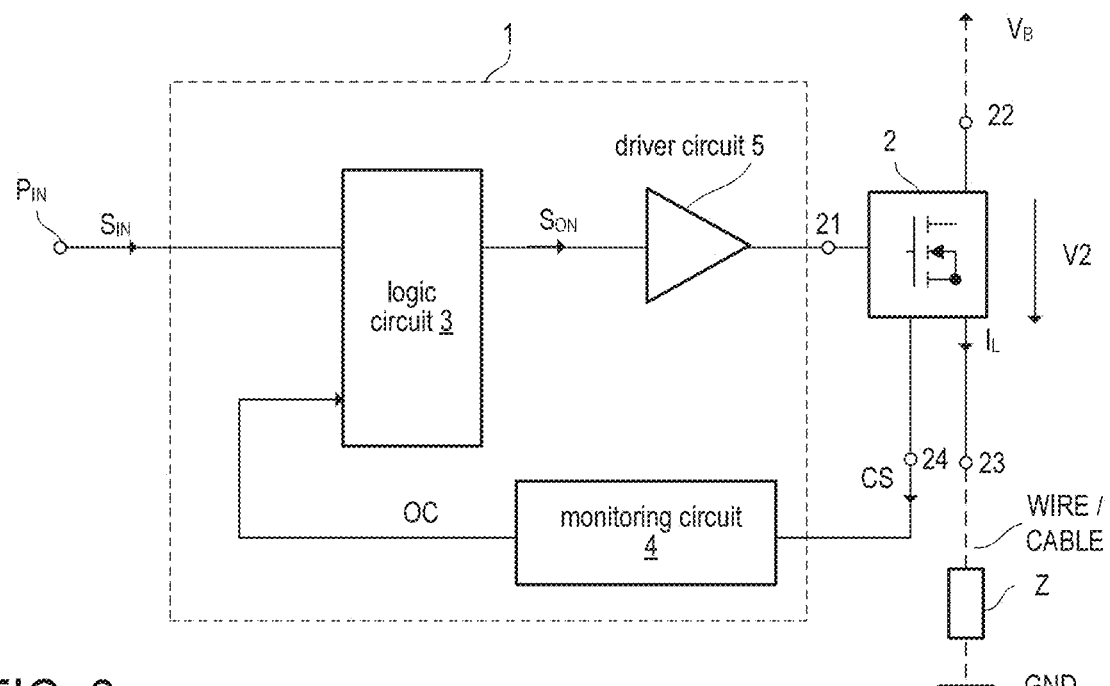
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a protection signal OC based on a current-time-characteristic of the load current $i_L$. The expression "to generate the protection signal OC based on the current-time-characteristic of the load current $i_L$" may include that the monitoring circuit 4 processes an instantaneous current amplitude of the load current $i_L$ as well as previous current amplitudes to generate the protection signal OC. That is, the monitoring circuit 4 evaluates the load current $i_L$ over a certain time period in order to generate the protection signal OC. To evaluate the load current $i_L$, the monitoring circuit 4 receives a current sense signal CS and generates the protection signal OC based on the current sense signal CS. The current sense signal CS represents the load current $i_L$ and, according to one example, may be proportional to the load current $i_L$. In the example of FIG. 2, the current sense signal CS is available at a sense output 24 of the electronic switch 2. In this case, a current measurement circuit configured to measure the load current $i_L$ and provide the current sense signal CS may be integrated in the electronic switch 2. However, this is only an example. A current measurement circuit separate from the electronic switch 2 may be used as well. Various current sense circuits (e.g. shunt resistors, Sense-FET circuits, etc.) are known and are thus not further explained herein in more detail. One specific example of a current sense circuit is included in FIG. 8 and will be discussed further below.

The control circuit 1 illustrated in FIG. 2 is configured to drive the electronic switch 2 based on the protection signal OC and an input signal $S_{IN}$ received at a first input node (e.g. input pin) $P_{IN}$ of the electronic fuse circuit F. The protection signal OC, as well as the input signal $S_{IN}$, are supplied to a logic circuit 3, which generates a drive signal $S_{ON}$ based on the protection signal OC and the input signal $S_{IN}$. The drive signal $S_{ON}$ is directly or indirectly (e.g. via driver circuit 5) supplied to the control node 21 of the electronic switch 2 in order to switch the electronic switch 2 on or off. According to one example, the drive signal $S_{ON}$ may be a logic signal that has an on-level indicating that it is desired to switch the electronic switch 2 on or an off-level indicating that it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor, such as a MOSFET (as schematically illustrated in FIG. 2). A MOSFET is a voltage controlled semiconductor device that switches on or off dependent on a drive voltage applied between a gate node and a source node. In this example, the driver 5 is configured to generate the drive voltage (gate voltage $V_G$) based on the drive signal $S_{ON}$ in order to switch on or off the MOSFET in accordance with the drive signal. When using MOSFETs, the driver 5 is also referred to as gate driver.

Figure 3:
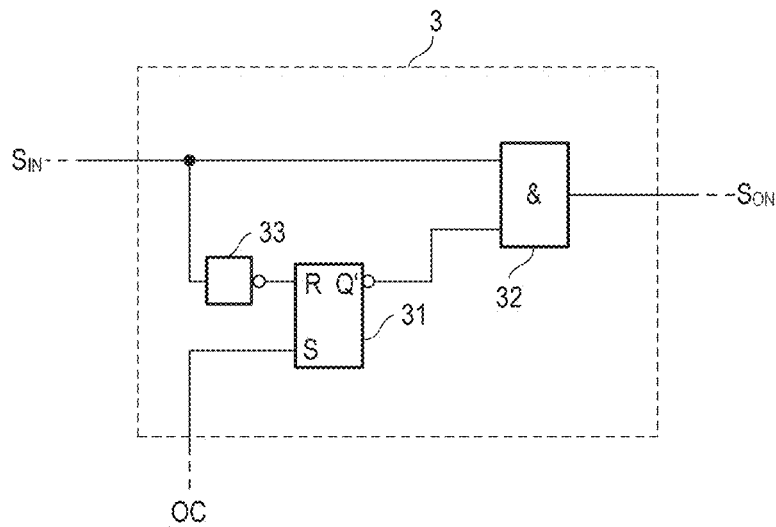
FIG. 3 illustrates one example of a logic circuit used in the control circuit of FIG. 2.

The circuit of FIG. 3 illustrates one exemplary implementation of (a part of) the logic circuit 3. In the present example, the logic circuit 3 includes an inverter 33, an SR latch 31 (flip-flop) and an AND gate 32. A first input of the AND gate 32 is configured to receive the input signal $S_{IN}$, whereas a reset input R of the SR latch 31 is configured to receive the inverted input signal provided by inverter 33. The set input S of the SR latch 31 is configured to receive the protection signal OC. The inverting output Q' of the SR latch 31 is connected with a second input of the AND gate 32. The drive signal $S_{ON}$ is provided at the output of the AND gate 32. The function of the logic circuit 3 is further illustrated by the timing diagrams of FIG. 4. The initial low level of input signal $S_{IN}$ causes a reset of the SR latch 31, which results in a high level at the inverting output Q' of the SR latch 31. Accordingly, both inputs of the AND gate 32 "see" a high level, and thus the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input, and thus the output of the AND gate 32 provides the drive signal $S_{ON}$ with a low-level. In other words, the input signal $S_{IN}$ is fed through the logic circuit 3 (i.e. the drive signal $S_{ON}$ equals the input signal $S_{IN}$) provided that the SR latch 31 is in its reset state. Once the SR latch 31 is set by the protection signal OC changing to a high-level, the inverting output Q' of the SR latch 31 is set to a low level (see FIG. 4, time instant $t_3$). Accordingly, the AND gate 32 sees a low level at its second input and thus the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2 and a reset of SR latch 31, see FIG. 4, time instant $t_4$) and again to a high level (indicating a switch-on of the electronic switch 2, see FIG. 4, time instant $t_5$). It is again noted that the function of the exemplary implementation of FIG. 3 may be implemented in various other ways.

Figure 5A:
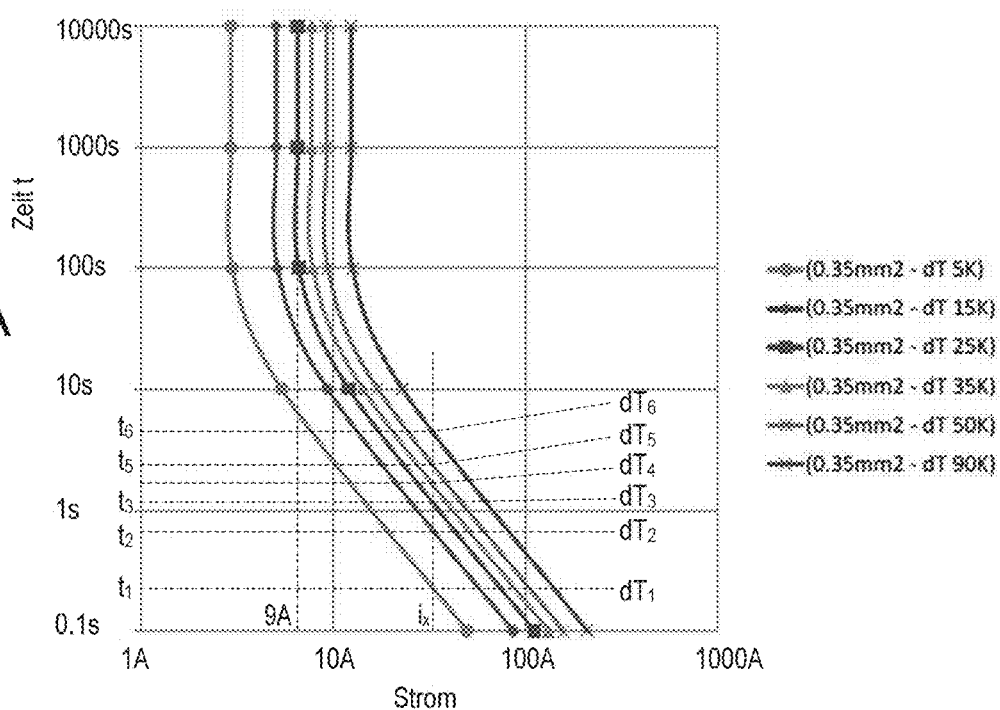
FIG. 5A is a diagram illustrating a family of characteristic curves (time over current) for a 0.35 $mm^2$ cable and for different maximum cable temperatures.
Figure 5B:
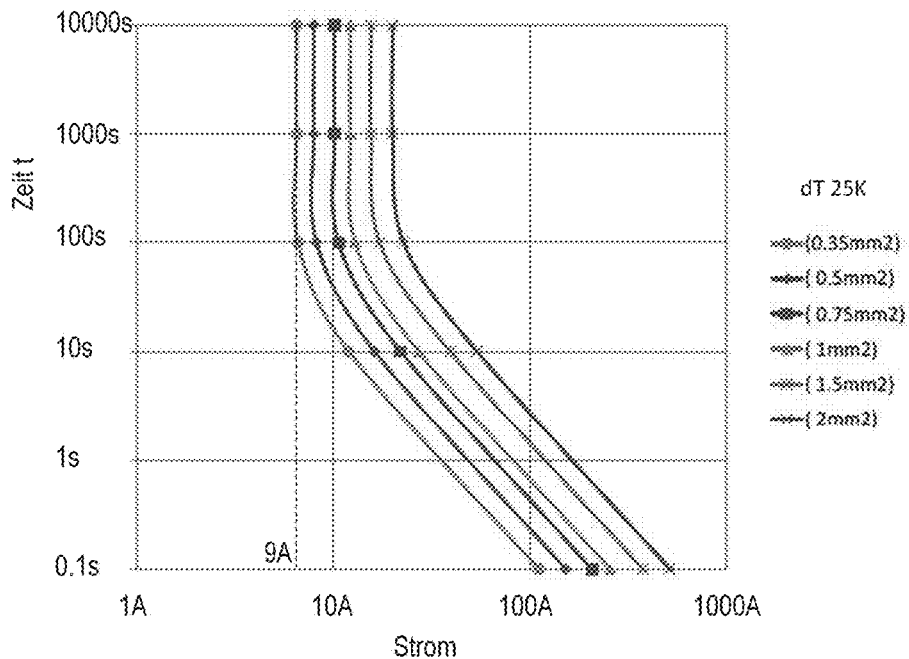
FIG. 5B is a diagram illustrating a family of characteristic curves (time over current) for a maximum cable temperature of 25 Kelvin above ambient temperature and for different cable cross-sections.

As mentioned above, the wire connecting load Z and electronic fuse circuit F may be designed to withstand a nominal current of the load Z. The lifetime of a wire (or a cable) depends on the wire temperature. FIGS. 5A and 5B are diagrams showing a family of characteristic curves, wherein each characteristic curve is associated with a specific combination of maximum temperate difference dT (maximum temperature above ambient temperature) and cable cross section (e.g. cross-sectional area in mm$^2$). Each characteristic curve represents the relation between the current and the maximum allowable time period during which the wire can carry the current without exceeding the maximum temperature difference. FIG. 5A includes characteristic curves for various temperature differences dT and a specific cross-sectional area of 0.35 mm$^2$, while FIG. 5B characteristic curves for a specific temperature differences dT of 25 K (Kelvin) and various cross sectional areas. As can be seen from FIGS. 5A and 5B, a wire with a cross-sectional area of 0.35 mm$^2$ may carry a current of approximately 9 A (amperes) for practically infinite amount of time without exceeding a temperature difference dT of 25 K above ambient temperature. As can be seen from FIG. 5B, a wire with a cross-sectional area of 0.75 mm$^2$ may carry a current of 10 A (amperes) for approximately 100 seconds before exceeding a temperature difference dT of 25 K above ambient temperature. Generally, the higher the current, the shorter the allowable time period for a given cross-sectional area and a given temperature difference. It is noted that the characteristic curves shown in the diagrams of FIGS. 5A and 5B have a linearly falling branch in a double logarithmic representation.

As can be seen from FIGS. 5A and 5B, a temperature difference $dT_x$ (e.g. temperature values $dT_1$, $dT_2$, $dT_3$, $dT_4$, $dT_5$, $dT_6$) is associated with a given integration time $t_x$ (e.g. times $t_1$, $t_2$, $t_3$, $t_4$, $t_5$, $t_6$) for a given current (see FIG. 5A, current $i_x$) and a specific cross-sectional area (e.g. 0.35 mm$^2$ in the example of FIG. 5A). Hence, a temperature value dT (representing the temperature above ambient temperature) may be determined for a specific wire cross section by integrating the current $i_L = i_x$ passing through the wire over time, and the protection signal OC may indicate a switch-off of the electronic switch 2 when the temperature value dT reaches a defined first reference temperature difference $dT_R$. The mentioned integration may be efficiently implemented using digital filters, which may be included in the monitoring circuit 4 (see FIG. 2). One exemplary implementation of a monitoring circuit is illustrated in FIG. 6.

Figure 6:
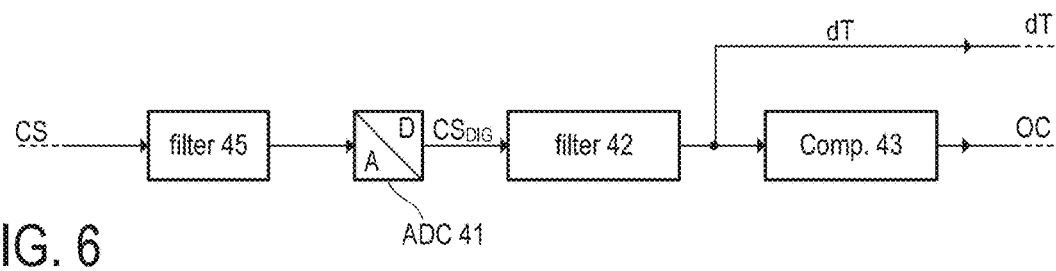
FIG. 6 illustrates one example of the monitoring circuit used in the example of FIG. 2

Basically, the monitoring circuit of FIG. 6 is configured to determine the protection signal OC based on the current sense signal CS. As mentioned, the integration may be accomplished in digital filter 42, which has an integrating characteristic. According to the depicted example, the current sense signal CS, which may be a voltage that is proportional to the load current $i_L$, is supplied to the input of filter 45, which may be an (optional) analog low-pass filter, to remove transients or the like that have a comparably high frequency. The output of filter 45 may be connected to the input of analog-to-digital converter (ADC) 41, which is configured to digitize the filtered current sense signal CS. The ADC 41 may have a logarithmic characteristic in order to account for the logarithmic characteristic curves shown in FIGS. 5A and 5B. The (e.g. logarithmized) digital current sense signal $CS_{DIG}$ is then converted to a temperature value dT by digital filter 42. The resulting temperature value dT (representing a temperature difference above ambient temperature) is then supplied to digital comparator 43, which may be configured to set the protection signal OC to a high-level when the temperature value dT provided at the output of digital filter 42 exceeds the first reference temperature difference $dT_R$ (e.g. 25 K) specified for a specific wire cross-section. It is noted that, if the ADC 41 does not have a logarithmic characteristic, the digital current sense signal $CS_{DIG}$ should be squared before being supplied to the filter 42. In this regard, reference is made to FIG. 8 as well as to publication US20170294772A1, in which this concept of temperature calculation is described.

As mentioned, the digital filter 42 is configured to convert the load current (represent by the digitized current sense signal $CS_{DIG}$) and an associated integration time, during which the current passes through the wire, into a temperature value. In the present example, the filter characteristic 42 depends on a parameter characterizing the wire, e.g. the cross-sectional area of the wire, which carries the current and which may be represented by a family of characteristic curves such as those shown in the diagram of FIG. 5A (for an exemplary cross-sectional area of 0.35 mm$^2$). In one specific example, the characteristic curves (or related curves) may be stored as a look-up table, i.e. by storing a plurality of sampling points of the characteristic curves in a memory. Values between two sampling points may be determined using, e.g. interpolation.

Conventional fuses are produced for a specific trigger current and with a specific trigger time (slow blow fuses, medium blow fuses, fast blow fuses), wherein the trigger time corresponds to a specific combination of reference temperature $dT_x$ and cross-section as explained above (see FIGS. 5A and 5B). It would be desirable, however, to have a configurable fuse that may be used for various wire parameters such as, for example, wire cross-sections and maximum temperature values $dT_R$ (maximum temperature above ambient temperature).

Figure 7:
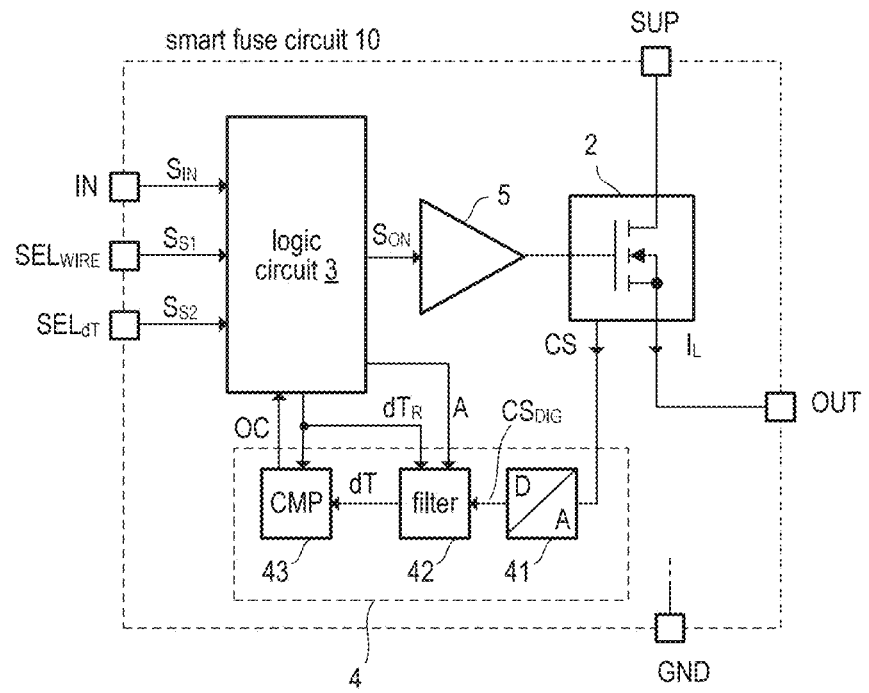
FIG. 7 illustrates a first example of an e-fuse ("smart fuse") circuit that allows selection of wire cross section and maximum cable temperature.

FIG. 7 illustrates one example of an electronic fuse circuit, which is further referred to as smart fuse circuit 10. The circuit of FIG. 7 is substantially the same as the circuit of FIG. 2 and reference is made to the respective description. However, the logic circuit 3 is more sophisticated than in the example of FIG. 2 and the monitoring circuit 4 is implemented in accordance with FIG. 6, wherein the analog low-pass filter 45 has been omitted (the low-pass filter 45 is optional). However, different from the example in FIG. 6, the monitoring circuit 4 is configurable in the present example so that its characteristic can be selected based on at least one wire parameter, which allows, for example, to select a characteristic for a specific wire cross section and/or a desired reference temperature difference $dT_R$. In the examples described herein, the at least one wire parameter is or represents the cable cross-sectional area and/or the maximum temperature value above ambient temperate or both. As can be seen in the diagrams of FIGS. 5A and 5B, these two wire parameters define a specific characteristic curve, which represents the desired behavior of the electronic fuse circuit for a specific wire/cable. It is understood that other parameters such as wire diameter or absolute temperature (e.g. in case ambient temperature is measured) may be used as wire parameters. Furthermore, a wire parameter is not necessarily proportional to any physical quantity (such as cross-sectional area or temperature) but can be a mere numerical parameter, which allows determining (e.g. selecting) the desired characteristic used by the monitoring circuit. As shown in FIG. 7, the electronic fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages. In the example of FIG. 7 all the depicted circuit components are integrated in one semiconductor chip.

The load current path of the electronic switch 2 may be connected between a supply pin SUP and an output pin OUT of the smart fuse circuit 10. Generally, the logic circuit 3 may be configured to receive at least one wire parameter, which, in the present example, includes information about a wire cross-sectional area A and a reference temperature difference $dT_R$, from a microcontroller or other control circuitry. As illustrated in FIG. 6, the logic circuit 3 may be configured to receive signals from a controller via input pin IN (input signal $S_{IN}$, see also FIG. 2) and input pins $SEL_{WIRE}$ and $SEL_{dT}$ (selection signals $S_{S1}$ and $S_{S2}$ representing a wire cross-sectional area and a temperature difference) and to provide a drive signal $S_{ON}$ for the electronic switch 2. The driver 5 may be configured to convert the signal $S_{ON}$, which is a binary logic signal, into a drive voltage or drive current suitable to switch the electronic switch 2 on and off. As in the example of FIG. 2 the monitoring circuit 4 receives an (analog) current sense signal CS and generates, based on this current sense signal CS, the protection signal OC, which may be processed by the logic circuit 3, for example, as shown in the example of FIG. 3.

Figure 4:
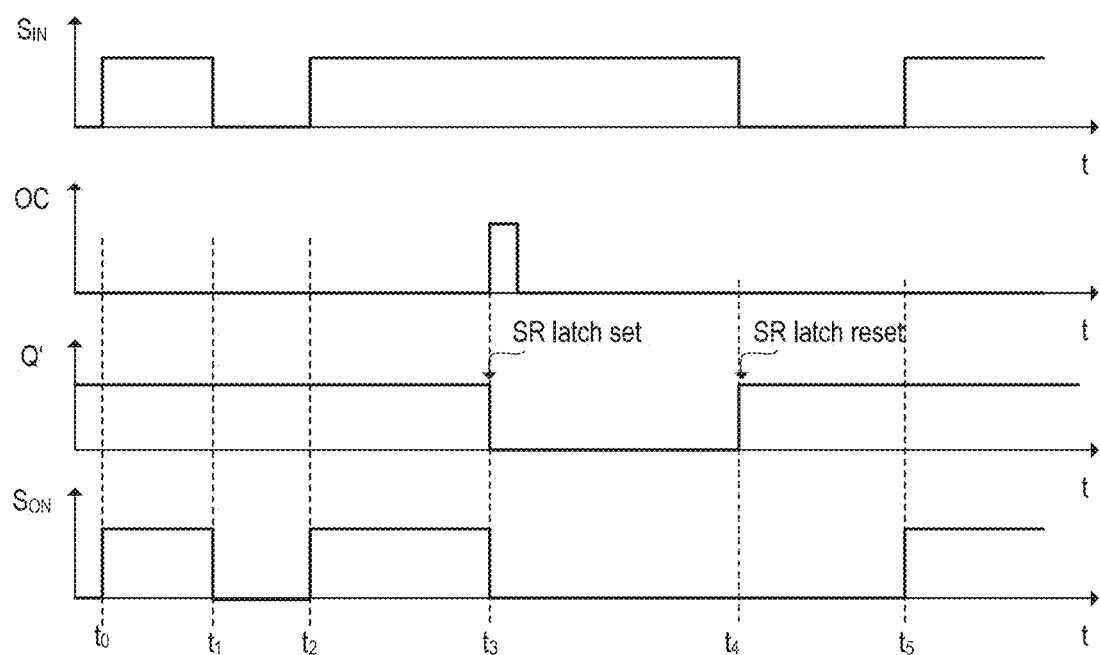
FIG. 4 shows timing diagrams illustrating the function of the control circuit shown in FIG. 2.

Based on the information included in the at least one wire parameter and received, e.g., from the controller, the control logic 3 may configure the digital filter 42 and/or the comparator 43 so that the characteristic of the monitoring circuit 4 corresponds to a specific combination of wire cross-sectional area A and reference temperature difference $dT_x$. In the present example, the monitoring circuit 4 can be configured based on the selection signals $S_{S1}$ and $S_{S2}$ received at the input pins input pins $SEL_{WIRE}$ and $SEL_{dT}$. Thus, the selection signal $S_{S1}$ may represent, as a first wire parameter, a reference temperature difference $dT_R$ (which may be used as a temperature threshold in the comparator 43) and the selection signal $S_{S2}$ may represent, as a second wire parameter, a cross-sectional area A of the wire. The ground pin GND shown in FIG. 4 is coupled to a reference potential, e.g. ground potential, and connected to the logic circuit 3, and other circuit components that need a reference potential for proper operation. It is noted that, in the case of a single (analog) input pin, it may be sufficient to select a wire with a desired cross-section and temperature difference. Further, it is understood that, in another embodiment, the first and the second wire parameter may also be coded into a single (e.g. digital) selection signal. It is understood that the specific mechanism of how the information is provided to the logic circuit is not relevant. Basically, the monitor circuit is configured to be suitable for a specific wire.

Figure 8:
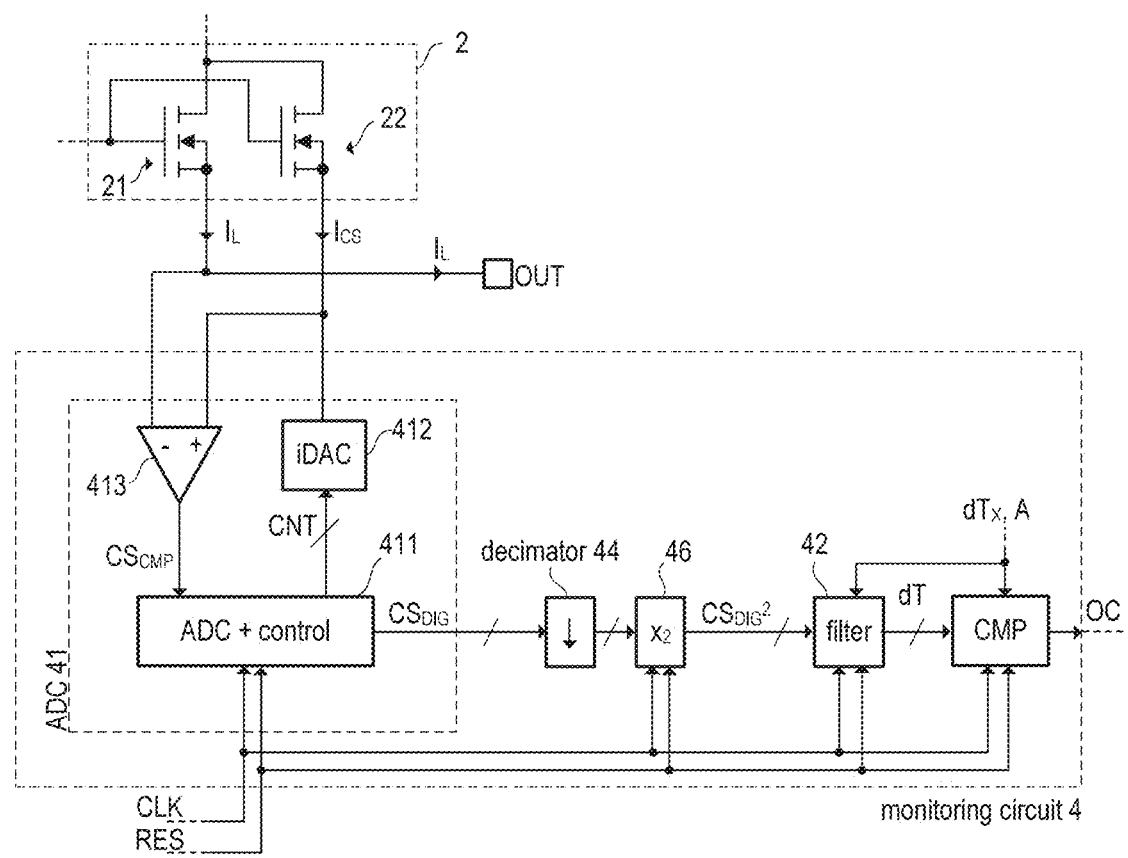
FIG. 8 illustrates one further example of the monitoring circuit used in the embodiment of FIG. 2.

FIG. 8 illustrate another exemplary embodiment of the monitoring circuit 4 in more detail. FIG. 8 also illustrates one example of how the current sensing may be implemented in more detail. For the purpose of current measurement, a so-called Sense-FET circuit is used. That is, the electronic switch actually includes two MOSFET transistors 21 and 22; transistor 21 is the actual load transistor that is coupled between a supply node (supply pin SUP) and output node (output pin OUT) and it carries the load current $i_L$, and transistor 22 is configured as sense transistor that provides a sense current $i_{CS}$ indicative of the load current. The gate electrodes of load transistors 21 and sense transistor 22 are connected and receive the same gate voltage. Similarly, the gate electrodes of load transistors 21 and sense transistor 22 are connected and receive the same drain voltage (supply voltage $V_B$ in case of a high-side configuration). The source current of the sense transistor is referred to as sense current $i_{CS}$, which is substantially proportional to the load current $i_L$ (source current of load transistor 21) when the drain-source-voltages of both transistors 21, 22 are equal. In this case, the two transistors are operated in the same operating point and the ratio of the source currents $i_L/i_{CS}$ equals the ratio $A_{21}/A_{22}$ of the active areas of transistor 21 and transistor 22.

The monitor circuit 4 of FIG. 8 receives the current sense signal, which is the sense current $i_{CS}$ is the present example, and generates a respective digital current sense signal $CS_{DIG}$. The analog-to-digital converter (ADC) 41 may be a counter type ADC or a SAR (Successive Approximation Register) type ADC. Accordingly, the ADC 41 includes a control circuit 411, a current-output digital-to-analog converter (DAC) 412 and a comparator 413. The control circuit 411 is configured to modify a digital register CNT in accordance with a given scheme and the resulting analog current sunk from the source terminal of the sense transistor 22. That is, the output node of the current-output DAC is connected to the source electrode of the sense transistor 22 and, thus, the source current of the sense transistor is practically set by the DAC 412. The comparator 413 is configured to compare the source potentials of load transistor 21 and sense transistor 22 and indicates (by a level change at its output) when the source potentials are equal. As mentioned, in this situation the sense current $i_{CS}$ is proportional to the load current $i_L$ and, thus, the value of register CNT represents the load current and is output as digital current sense signal $CS_{DIG}$. In a simple implementation, the control circuit 411 may basically include a counter that is regularly reset and adds up (thereby ramping up the DAC output current) until the comparator 413 indicates that the source potentials of transistors 21, 22 are equal. As mentioned, more sophisticated schemes (such as SAR) may be used to modify the register CNT.

Dependent on the implementation, the monitoring circuit 4 may (optionally) include a decimator 44 to reduce the data rate of the digital data stream provided by the ADC 41. The monitoring circuit 4 may further include the squaring unit 45 configured to calculate the square of the digital current sense signal $CS_{DIG}$. The squaring unit 45 is optional and can be omitted when the ADC 41 has a logarithmic characteristic as already mentioned above. In the example depicted in FIG. 8, the ADC 41 has a linear characteristic and the squared current sense signal $CS_{DIG}^2$ is filtered using a digital filter 42. The filter 42 may include an integrating characteristic, as already discussed above, and the filter output signal represents the cable temperature and indicates a temperature difference dT of the cable above ambient temperature.

Digital comparator 43 is used to compare the temperature difference dT with a threshold and indicate an overcurrent (signal OC) when a reference temperature difference $dT_R$ is exceeded. It is noted that the digital circuitry included in monitor circuit 4 operates using a clock signal CLK and needs to be initialized to a specific initial state, which is usually done by a reset signal RES.

In practical applications, voltage transients may occur on the battery line due to electrostatic discharges (ESD) and/or electromagnetic disturbances, which can cause voltage variations on in the chip, and these may cause an undesired reset of the digital circuitry included in the monitoring circuit 4. Inter alia, the state of the filter 42 (which may be implemented as FIR filter) may be lost due to such an undesired reset and, as a consequence, the digital circuity "forgets" the current difference temperature dT. As a consequence, an over-temperature may be detected too late or not at all (e.g. in case of a regular reset due to periodic disturbances like the so-called ISO pulses defined in ISO 7637). In order to increase robustness against electrostatic disturbances and thus improve electromagnetic compatibility (EMC), an additional protection circuit may be coupled to the monitoring circuit 4 which stores the "state" of the monitoring circuit in a way that it will not be deleted or otherwise manipulated by undesired resets caused by electrostatic disturbances. One simple example is illustrated in FIG. 9.

Figure 9:
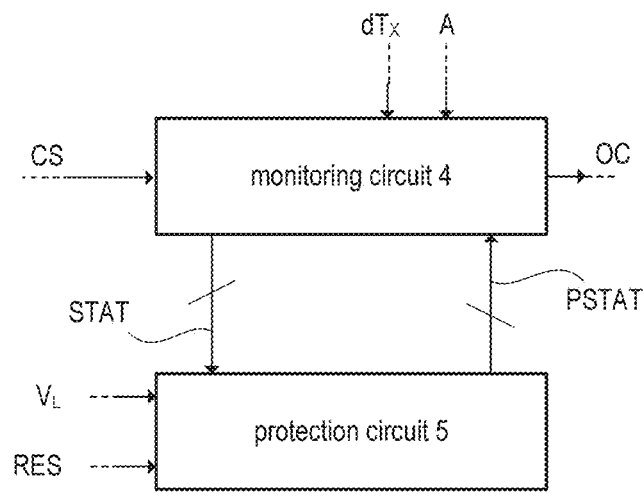
FIG. 9 illustrates one general example of a protection circuit coupled to the monitoring circuit of FIG. 2 to store the state of the monitoring circuit.

FIG. 9 illustrates the monitoring circuit 4 that receives the analog current sense signal CS (e.g. the sense current $i_{CS}$ as shown in FIG. 8) and which provides the overcurrent signal OC at its output. The level of the signal OC is determined based on the (digitized) current sense signal, parameters that represent the wire characteristics (e.g. cross-section A and reference temperature difference $dT_R$) and state variables STAT that represent the state of (the digital circuitry included in) the monitoring circuit 4. Basically, the digital part of the monitoring circuit 4 can be regarded as a sequential logic circuit, whose output is determined, in each clock cycle, dependent on the current input and the current state. This behavior distinguishes sequential logic from combinational logic, the output of which is purely a function of the current input and thus does not depend on a state of the circuit. For the present discussion, the term "state of the monitoring circuit" may include all data that potentially affects the output of the circuit in addition to the input data (i.e. the digital current sense signal $CS_{DIG}$). For example, the filter 42 (see FIG. 8) may be implemented as a Finite Impulse Response (FIR) filter, the current output value of which may depend on its current input value as well as a number of previous output values. Accordingly, the previous output values, inter alia, represent the state of the monitoring circuit 4, which is represented by the state variable STAT. Generally, the state variable may be regarded as a digital word composed of a plurality of bits.

In the example of FIG. 9, the state STAT of the monitoring circuit, is provided to a protection circuit 5, which is configured to store the state STAT in a way that it is not corrupted by electromagnetic disturbances that may cause an undervoltage situation in the digital supply of the monitoring circuit 4, which can lead to an undervoltage reset. For example, the ISO pulse E1 as defined in ISO 7637 results in negative voltage values thereby causing the above-mentioned undervoltage situation. In this regard it is noted that the mentioned undesired reset, which is caused by an ESD disturbance, is triggered by mechanisms that are different from an intentional reset triggered by the reset signal RES. In each clock cycle, the protection circuit 5 stores the state variables STAT in one or more protected registers and, in the next cycle, the monitoring circuit 4 uses the protected state variable PSTAT for calculating the updated state and output. In order to intentionally reset the protected registers included in the protection circuit 5, the protection circuit receives the reset signal RES (which is also used in the monitoring circuit, see FIG. 8). Further, the protection circuit 5 receives the supply voltage $V_L$, which may also be used to supply the digital circuitry of the monitoring circuit 4.

Figure 10:
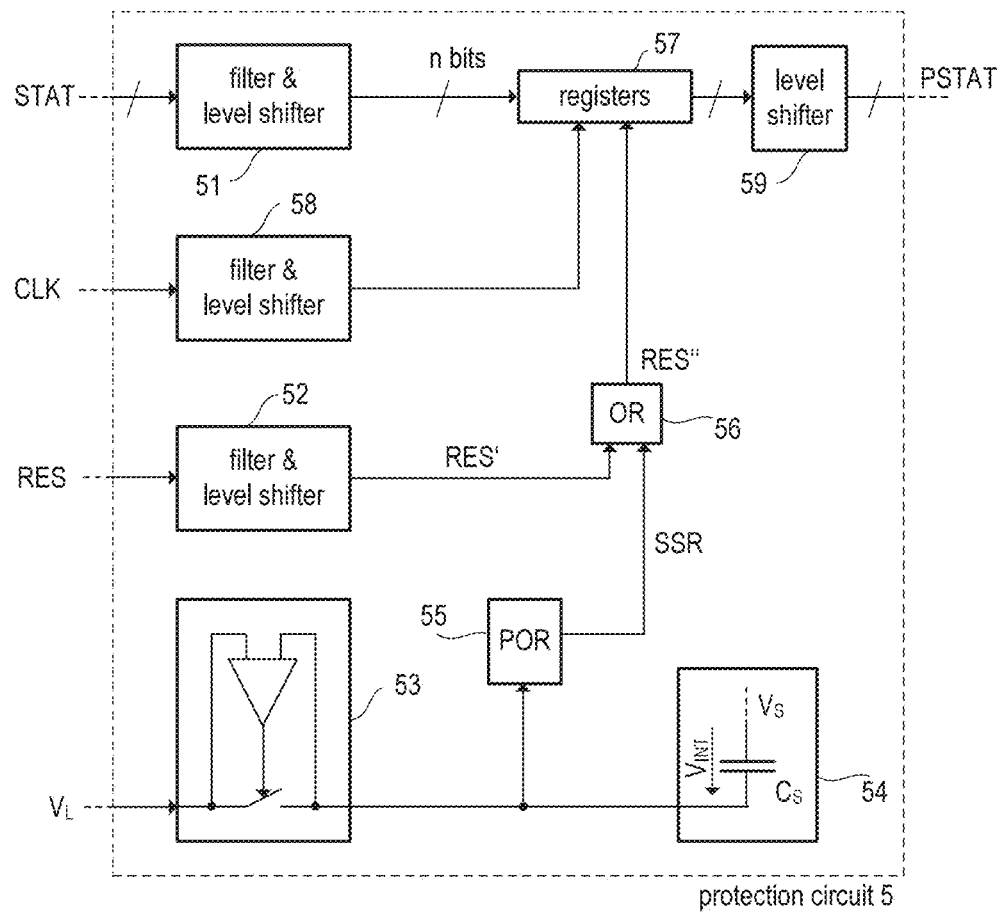
FIG. 10 illustrates one exemplary embodiment of the protection circuit of FIG. 9.

FIG. 10 illustrates one example of the protection circuit 5. The protected registers mentioned are denoted by numeral 57. The protected register(s) 57 receive the state variable(s) STAT (e.g. one or more N bit words) via a preprocessing unit 51, which may comprise a filter, e.g., a spike filter, and a level shifter. Another preprocessing unit 52 is provided for receiving the reset signal RES. The preprocessing unit 52 may be implemented substantially in the same way as the preprocessing unit 51 and thus may include a filter and a level-shifter. The output of the preprocessing unit 51 (labelled RES' in the example of FIG. 10) is connected to the first input of an OR gate 56. A further preprocessing unit 58, which may also include a level shifter (and optionally a filter), may be included in the protection circuit 5 to provide the clock signal CLK (see also FIG. 8) to the protected register(s) 57. The clock signal may be needed in the protection circuit 5 as the digital part of the protection circuit 5 may be implemented as a sequential logic. Moreover, a further level shifter 59 is used to adjust the level of the register output values PSTAT.

The protection circuit 5 may further include a supply decoupling unit 53, which receives the supply voltage $V_L$. The supply decoupling unit 53 is further connected to a supply supervision unit 55 as well as to an internal supply circuit 54. The output of the supply supervision unit 55 (labelled SSR in the example of FIG. 10) is connected to the second input of the OR gate 56.

The output of the OR gate 56 provides a register reset signal RES" to the protected register(s) 57. Hence, protected register(s) 57 is (are) reset when any of the inputs of the OR gate 56 equals logic "1", which is the case if either a reset is signaled by reset signal RES or the supply supervision unit 55 indicates that the register(s) 57 is (are) to be reset (see below).

The output of the protected register(s) 57 is labelled as PSTAT and represents the stored state of the monitoring circuit 4. In the present example, the stored state variable has the same word length as the state variable STAT received from the monitoring circuit.

The above-mentioned supply decoupling unit 53 compares the voltage signal $V_L$ at its input with the signal provided by the internal supply 54. If the voltage $V_L$ at the input falls below a predetermined voltage threshold, the connection to the input is interrupted (e.g., by opening an electronic switch) and the energy stored in the internal supply 54 is used to supply the circuit components included in the protection circuit 5. The predetermined voltage threshold may be equal to or depend on the voltage provided by the internal supply 54. The internal supply circuit 54 may include a buffer capacitor $C_S$ that is arranged between the output of the supply decoupling unit 53 and the supply voltage $V_S$ (e.g. battery voltage, see FIG. 2). This capacitor $C_S$ may be dimensioned to supply the circuit components of the register(s) 57 for a duration of, e.g., 20 μs, which may suffice to provide sufficient supply voltage level during short ISO pulses or similar electromagnetic disturbances.

The supply supervision unit 55 monitors the voltage level provided by the capacitor $C_S$. For example, if the voltage decreases to or below a predefined first threshold, the supply supervision unit 55 may issue a reset signal for resetting the protected register(s) 57. This may be applicable if the charge stored in the capacitor $C_S$ does not suffice and/or the power supply is switched off for a period longer than that intended to be buffered by the capacitor $C_S$.

According to a further example, if the voltage increases (e.g., after a power on) and reaches or exceeds a predetermined second threshold, the supply supervision unit 55 may trigger a reset signal SSR (power-on-reset, POR) as soon as it is powered up (e.g., in case the voltage at the supply supervision unit 55 exhibits a rising edge) and maintains this reset signal for a predetermined amount of time, e.g., 1 μs. This time may suffice to initialize, i.e. reset, the protected registers 57 after the power has been switched on. As soon as the predetermined amount of time has passed, the supply supervision unit 55 stops issuing the reset signal SSR. This power on reset (POR) functionality ensures that protected registers 57 are in a defined state after the e-fuse circuit has been powered up.

The internal supply 56 may become decoupled/disconnected in the event that the voltage $V_L$ supplied to the input of the supply decoupling unit 53 falls below the predetermined threshold, e.g. in the event that the voltage $V_L$ is lower than the voltage provided by the internal supply 54. In such an event, the internal supply 54 (e.g., via the capacitor $C_S$) provides power for the registers such that the values stored therein are maintained (for as long as the internal supply power lasts). Supplying the registers 57 may require only a small amount of energy. This allows using a buffer comprising the capacitor $C_S$ with a capacitance in the range of a few picofarad.

Figure 11:
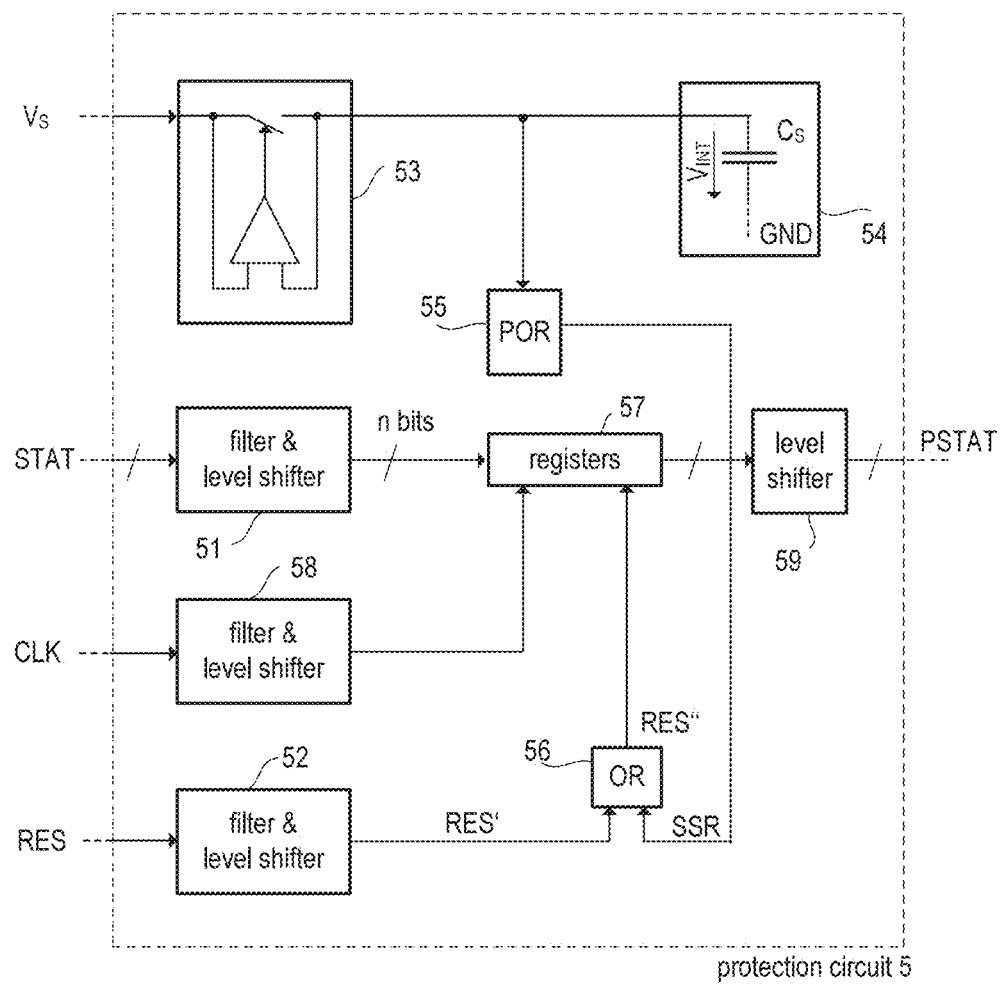
FIG. 11 illustrates another exemplary embodiment of a protection circuit.

FIG. 11 illustrates a further example of the protection circuit 5, which is very similar to the previous example of FIG. 10. Different from the example of FIG. 10, the present embodiment receives the upper supply voltage $V_S$, which is provided to the internal supply circuit 54 via decoupling unit 53. The internal supply circuit 54 includes a buffer capacitor $C_S$ that is arranged between the output of the supply decoupling unit 53 and ground potential. In the event that the decoupling unit 53 disconnects the supply circuit 54 from the supply voltage input at which the voltage $V_S$ is provided, the supply circuit 54 provides the "stored" capacitor voltage (with respect to ground) as internal supply voltage to the protected register 57. In contrast, in the previous example of FIG. 10, the supply circuit 54 provides the "stored" capacitor voltage with respect to the upper supply voltage $V_S$ as internal supply voltage. Apart from the fact that the upper supply voltage is disconnected in the event of a transient pulse instead of the lower supply voltage $V_L$, the examples of FIGS. 10 and 11 are identical and reference is made to the description above to avoid reiterations. Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A circuit comprising:
an electronic switch having a load current path coupled between an output node and a supply node and configured to connect or disconnect the output node and the supply node in accordance with a drive signal;
a monitoring circuit configured to receive a current sense signal representing the load current passing through the load current path and to determine a protection signal based on the current sense signal, a state of the monitoring circuit, and at least one wire parameter that characterizes a wire operably connected to the output node, the protection signal being indicative of whether to disconnect the output node from the supply node; and
a protection circuit connected to the monitoring circuit and configured to store the state of the monitoring circuit in one or more registers included in the protection circuit,
wherein the protection circuit is configured to receive a logic supply potential at an input node, and includes a supply circuit configured to provide a temporary supply for the protection circuit when a supply potential received at an input node deviates from an internal supply potential buffered by the supply circuit by more than a given threshold value.

2. The circuit of claim 1,
wherein the protection circuit further includes a supply decoupling unit configured to disconnect the input node from the supply circuit, when the logic supply potential received at the input node deviates from the internal supply potential by more than the given threshold value.

3. The circuit of claim 2,
wherein the protection circuit further includes supply supervision unit configured to receive the logic supply voltage via the supply decoupling unit and to generate a power-on reset signal for the one or more registers when the logic supply voltage exceeds a predetermined reset threshold.

4. The circuit of claim 1,
wherein the protection circuit further includes a first preprocessing unit including a level shifter coupled between the monitoring circuit and the one or more registers.

5. The circuit of claim 1,
wherein the protection circuit further includes a second preprocessing unit including a level shifter configured to receive a reset signal, an output of the second preprocessing unit being coupled to the one or more registers.

6. The circuit of claim 1,
wherein the monitoring circuit includes a filter, which has a filter state, the state of the monitoring circuit also indicating the filter state.

7. The circuit of claim 5,
wherein the monitoring circuit includes an analog-to-digital converter configured to digitize the current sense signal and generate a respective digital current sense signal.

8. The circuit of claim 7,
wherein the filter is configured to filter a signal which represents the digital current sense signal, the filter output signal being indicative of a wire temperature difference above ambient temperature.

9. The circuit of claim 8,
wherein the monitoring circuit further includes a comparator configured to generate the protection signal dependent on a comparison of the filter output signal and a reference value.

10. The circuit of claim 1,
wherein the monitoring circuit includes a sequential logic that is configured to generate the protection signal, and
wherein the state of the monitoring circuit is a state of the sequential logic.

11. A method comprising:
establishing and disconnecting a load current path between a supply pin and an output pin by switching a transistor on and off;
generating a current sense signal indicative of a load current passing through the transistor;
determining, using a monitoring circuit, a protection signal based on the current sense signal, a state of the monitoring circuit, and at least one wire parameter that characterizes a wire connected to the output node, the protection signal being indicative of whether to disconnect the output node from supply node; and
storing the state of the monitoring circuit in one or more registers included in a protection circuit,
providing, by a supply circuit included in the protection circuit a temporary supply for the one or more registers, when a logic supply potential received at an input node of the protection circuit deviates from an internal supply potential buffered by the supply circuit by more than a given threshold value.

* * * * *